US00RE35385E

United States Patent [19]

Gloton

[11] E Patent Number: Re. 35,385

[45] Reissued Date of Patent: Dec. 3, 1996

[54] METHOD FOR FIXING AN ELECTRONIC COMPONENT AND ITS CONTACTS TO A SUPPORT

[75] Inventor: Jean-Pierre Gloton, Aix en Provence, France

[73] Assignee: SGS-Thomson Microelectronics, SA., Gentilly, France

[21] Appl. No.: 336,560

[22] Filed: Nov. 9, 1994

Related U.S. Patent Documents

Reissue of:

[64] Patent No.: 4,941,257
Issued: Jul. 17, 1990
Appl. No.: 283,305
Filed: Dec. 12, 1988

U.S. Applications:

[63] Continuation of Ser. No. 912,867, Jul. 13, 1992, abandoned.

[51] Int. Cl.[6] ..... H05K 3/34

[52] U.S. Cl. ..... 29/840; 174/260; 228/180.2

[58] Field of Search ..... 29/840, 841; 156/244.12, 156/293, 295; 206/329; 235/492; 264/272.17; 437/180

[56] References Cited

U.S. PATENT DOCUMENTS

| | | | |
|---|---|---|---|
| 3,325,882 | 6/1967 | Chiou et al. | 29/846 |
| 3,387,363 | 6/1968 | Stelmak | 29/840 |
| 3,614,832 | 10/1971 | Chance et al. . | |
| 3,838,984 | 10/1974 | Crane et al. | 228/180.2 X |
| 3,859,723 | 1/1975 | Hamer et al. | 29/740 X |
| 3,998,377 | 12/1976 | Metz | 228/180.2 |
| 4,460,825 | 7/1984 | Haghiri-Tehrani et al. | 235/492 X |
| 4,474,292 | 10/1984 | Haghiri-Tehrani et al. | 206/329 |
| 4,667,402 | 5/1987 | Wilde | 29/840 |
| 4,674,175 | 6/1987 | Stampfli | 235/492 X |
| 4,763,409 | 8/1988 | Takekawa et al. | 228/180.2 X |
| 4,829,666 | 5/1989 | Haghiri-Tehrani et al. | 29/841 |
| 4,835,846 | 6/1989 | Juan et al. | 29/840 |
| 4,897,534 | 1/1990 | Haghiri-Tehrani | 235/492 X |
| 5,055,913 | 10/1991 | Haghiri-Tehrani | 235/492 X |

FOREIGN PATENT DOCUMENTS

| | | |
|---|---|---|
| 29785 | 11/1980 | European Pat. Off. . |
| 207853 | 1/1987 | European Pat. Off. . |
| 246973 | 11/1987 | European Pat. Off. . |
| 2483128 | 11/1981 | France . |
| 2088630 | 6/1982 | United Kingdom . |

OTHER PUBLICATIONS

IBM Tech Discl Bull, vol. 11, No. 3, Aug. 1968, pp. 309–310 by F. J. Kurtz.

*Primary Examiner*—Carl J. Arbes
*Attorney, Agent, or Firm*—Felsman, Bradley, Gunter & Dillon, LLP

[57] ABSTRACT

A method for positioning an electronic component and its contacts on a card is disclosed. The electronic component is first of all placed in the cavity of the card, then the electrical contacts are placed on the card and electrically connected to the output terminals by a so-called tape automatic bonding process using a film on which the electrical contacts are deposited.

9 Claims, 2 Drawing Sheets

METHOD FOR FIXING AN ELECTRONIC COMPONENT AND ITS CONTACTS TO A SUPPORT

Matter enclosed in heavy brackets [ ] appears in the original patent but forms no part of this reissue specification; matter printed in italics indicates the additions made by reissue.

*This ia a continuation of application Ser. No. 07/912,867, filed Jul. 13, 1992, abandoned.*

FIELD OF THE INVENTION

The invention concerns a method to position and fix an electronic component and its contacts on a support, such as an identification or identity card or a bank card, so that the electronic component is housed in the cavity and so that its contacts are fixed to the card.

DESCRIPTION OF THE PRIOR ART

Identification cards are used in many fields, especially in that of bank cards or credit cards. For a long time apart from an identification number and the bearer's number, these cards had only a magnetic recording, enabling him to be identified by magnetic reading. For many years now, these cards have been used for other functions than for identifying the bearer and, especially, for prepayment and protection against fraudulent activities. To this end, the card has an active electronic component, which may consist of an electronic memory which may or may not be associated with a microprocessor, thus enabling its use notably for banking type applications.

Credit cards made with this technology, which have an electronic component, are manufactured in various ways. According to a first method, a cavity is made in the thickness of the card to house the electronic component. According to another method, known as "colamination", thin layers of plastic material, such as an epoxy material, polyethylene, polyvinyl chloride etc. are laminated around the component. During the implementation of these methods, various other operations are further performed to connect the terminals of the electronic component, electrically, with metallizations placed on the surface of the card.

One of the methods used to install the electronic component in the cavity made in the card and to place the metallizations on the card, as well as to make the connections between the terminals of the card and the metallizations consists, as shown in FIG. 1, in the use of a non-conductive film 1, made of an epoxy material for example. This film has, on one side, the electronic component in the form of a chip (reference 2) and, on the other side, metallized surfaces such as those marked 3, 4 and 5, separated from one another by spaces 6 and 7 without metallization. These metallized surfaces 3, 4 and 5 communicate with the other side of the film 1 by means of holes 8, 9 and 10, through which the ends of the conducting wires 11, 12 and 13 get connected with the corresponding metallized surfaces by any known means, such as a conductive bonder. The other end of each conducting wire is connected to an output terminal 14, 15 or 16 of the chip 2.

These operations are then followed by the coating of the chip 2 with resin, and the curing of the resin, by heat, to encapsulate the chip. The chip can then be installed in the cavity of the card and the metallizations can be placed at the edge of the cavity by simply fitting in the chip and bonding the support film 1 to the card after it has been cut out to the requisite dimensions.

According to a method of this type, the electrical contacts and the chip or electrical component are first positioned on the film. Then, the electrical connection is made between the output terminals of the chip and the electrical contacts previously deposited on the film. After encapsulation, the set is installed on the card by bonding the encapsulated chip at the bottom of the cavity provided for this purpose, while the film is bonded to the edges of the cavity in such a way that the electrical contacts are accessible on the outside of the card.

This method has the drawback of necessitating a great many handling operations, notably to get the chip carried by the supporting film, then connected to the edges of the cavity, then encapsulated and finally positioned in the cavity. Furthermore, the encapsulating operation is very lengthy, for it is not possible to heat the resin beyond 150° C., the film and the bonder of the contacts would not stand up to a higher temperature.

The purpose of the present invention, therefore, is to implement a method which is designed to fix an electronic component and its contacts to a support such as an identity card, a method which does not have the drawbacks of prior art methods.

SUMMARY OF THE INVENTION

The invention, therefore, relates to a method to fix an electronic component and its contacts on a support, said support comprising a cavity to house said component, said method comprising the following operations:

(a) the positioning of an electronic component in the cavity, so that the output terminals of the component are accessible through the opening of the cavity;

(b) the positioning of the electrical contacts on a supporting film, according to a pattern appropriate to the geometry of the output terminals of the electronic component;

(c) the positioning of the electrical contacts on the support by means of the supporting film;

(d) the simultaneous electrical connection of said electrical contacts to the output terminals of the electronic component.

BRIEF DESCRIPTION OF THE DRAWINGS

Other features and advantages of the present invention will appear from the following description of a particular embodiment, said description being made with reference to the appended drawings, wherein.

DESCRIPTION OF PREFERRED EMBODIMENTS

Figure 1:
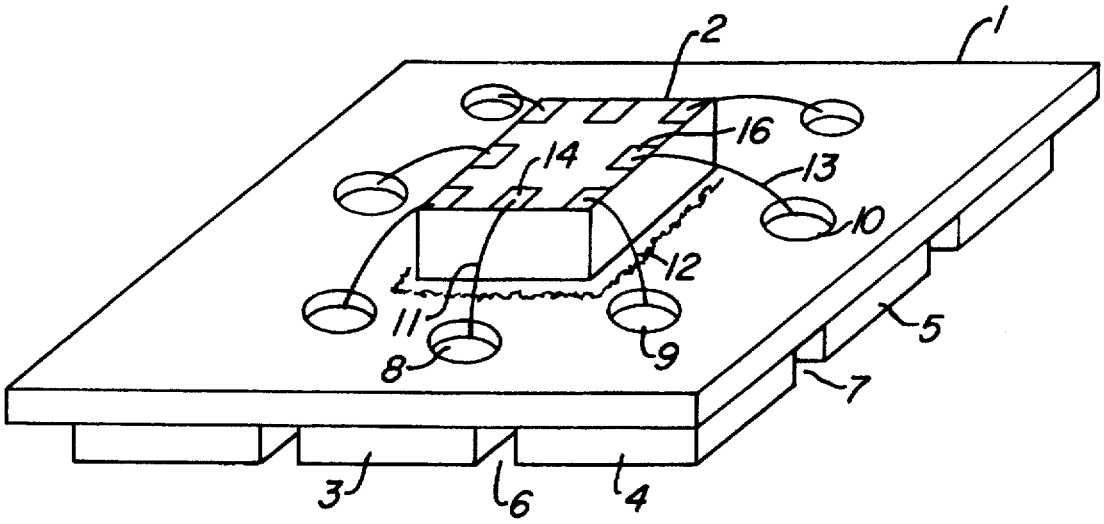
Fig. 1 PRIOR ART
FIG. 1 shows a perspective view of an electronic component and its connections arranged on a supporting film according to the prior art.

FIG. 1, which corresponds to a prior art method, has been described in the introduction. According to this method, first of all, the set comprising the electronic component and the electrical contacts is prepared on a separate support and then this set is assembled on the card. The invention is based on an entirely different approach so as to avoid, firstly, the operation in which the chip is electrically connected to the electrical contacts of the supporting film and, secondly, the encapsulation operation once the chip is on the supporting film.

This new method consists, first of all, in fixing the encapsulated or non-encapsulated chip in the cavity of the card so that its output terminals are flush with the level of the opening of the cavity. This operation is followed by a bonding of the contacts to the card and, simultaneously, by their electrical connection to the output terminals of the chip.

Figure 2:
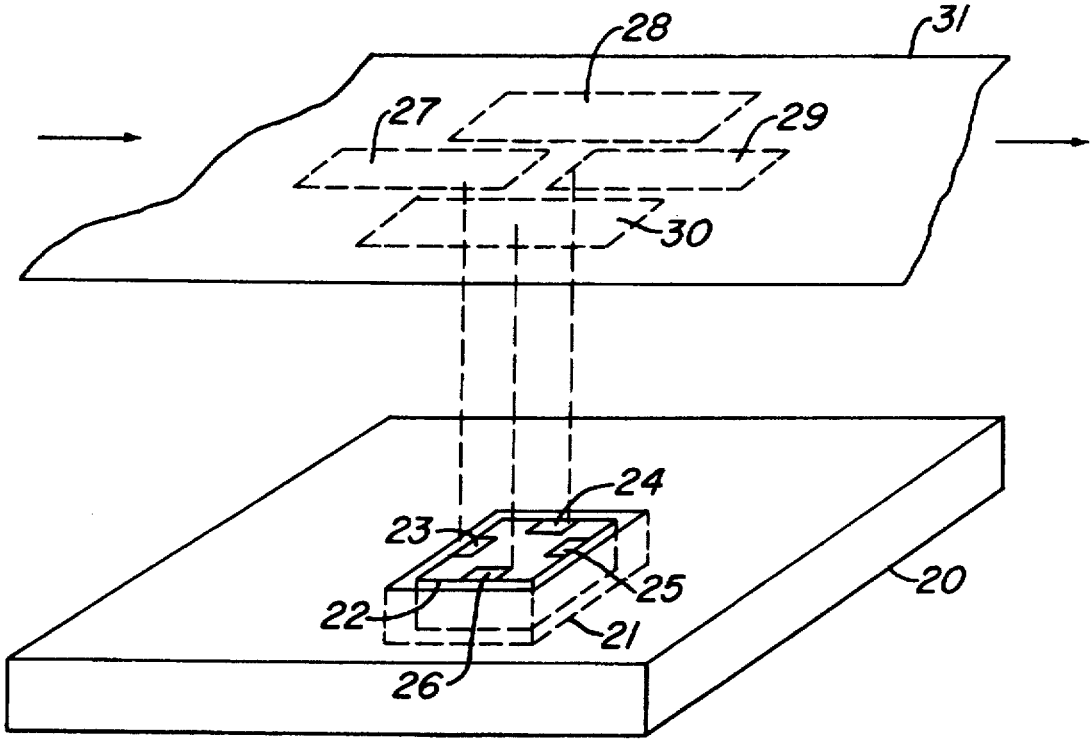
FIG. 2 is a perspective view showing the electronic component on the support before it is electrically connected, according to the invention, with the external electrical contacts.

FIG. 2 shows the card 20 comprising a cavity 21, the lower part of which is closed by the bottom of the card, while the upper part is open to enable the installation of an electronic component in the form of a chip 22. This chip 22 essentially consists of a silicon pad in which and on which a complex electronic circuit has been made in the form of integrated circuits. This complex electronic circuit has output terminals 23 to 26 which have been arranged so that they appear on the opening side of the cavity. Usually, to protect the chip and the output terminals, the set is coated with resin which lets the output terminals go beyond it. This resin is hardened by heating to a temperature of about 300° C. The chip 22 is housed in the cavity 21 and bonded to the base by any known method enabling precise positioning with respect to the card so that the output terminals 23 to 26 have precise positions in space, with a precision, for example, in the range of one hundred microns. This is a purely mechanical operation which raises no difficulties whatsoever in the present state of the art.

When the chip 22 is positioned in the cavity, the contacts are positioned on the card 20 and electrically connected to the output terminals 23 to 26. For this purpose, it is planned that contacts 27 to 30 will be deposited on a film 31 in an appropriate pattern. The contacts 27 to 30 are then transferred from the film 31 to the card 20 by bonding, pressing and heating. During this transfer operation, called tape automatic bonding, the contacts 27 to 30 get soldered, respectively, to the output terminals 23 to 26. Furthermore, when the pressing stops and the card is separated from the film 31, this film get detached from the contacts 27 to 30 which, for their part, remain bonded to the card 20.

Figure 3:
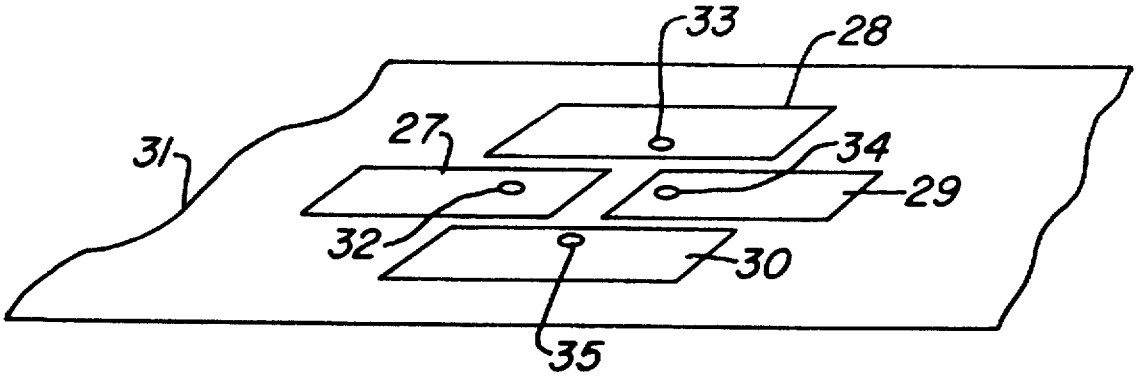
FIG. 3 is a perspective view of another arrangement of the support of the contacts which can be used according to the method of the invention.

As an alternative to the method, it is proposed (FIG. 3) to deposit on the card 20, not only the contacts 27 to 30, but also a cut-out part of the film 31. According to this alternative, the contacts 27 to 30 are deposited on the upper face on the film 31, and not on the lower face as shown in FIG. 2. To make it possible to set up the electrical connection with the output terminals 23 to 26, each contact 27 to 30 communicates with the lower face of the film through a hole 32 to 35 which is suitably placed with respect to the position of the associated output terminal. The film, or more precisely that part of the film which carries the contacts 27 to 30, is then bonded to the card 20 while the output terminals 23 to 30 are respectively soldered to the contacts 27 to 30 by means of the corresponding holes 32 to 35.

The contacts 27 to 30 can have various shapes which vary according to the geometry and arrangement of the output terminals 23 to 26 of the chip.

Moreover, the point of connection between the contact and the output terminal may also have various shapes. It may be a connection between two surfaces as is the case in FIG. 2, or a connection between a point and a surface or, again, between two points, as is the case in FIG. 3. There may also be a wire-to-wire connection if the contacts 27 to 30 are extended by conductors of small width, with their ends soldered to the output terminal of the electronic component.

What is claimed is:

1. A method to fix an electronic component and its external contacts on a support, said support comprising a cavity to house said component, said method comprising the following operations:

(a) positioning the electronic component (22) in the cavity (21), so that output terminals (23–26) of the component are accessible through the opening of the cavity;

(b) positioning the external electrical contacts (27–30) on a supporting film (31), according to a pattern appropriate to the geometry of the output terminals of the electronic component;

(c) positioning the electrical contacts on the support (20) by means of the supporting film (31);

(d) simultaneously electrically connecting said electrical contacts (27–30) to the output terminals (23–26) of the electronic component (22);

wherein prior to the first positioning step (a), the electronic component is coated with resin which allows the output terminals (23–26) to extend through said protective resin coating whereby the surface of the component is protected.

2. A method according to claim 1, wherein said resin is a heat setable resin and is hardened by heating to a temperature of about 300° C.

*3. A method of attaching an electronic component having output terminals to a supporting structure having an upper surface and a cavity opening upon the upper surface, comprising the steps of:*

*coating the electronic component with resin, wherein the output terminals remain uncovered;*

*positioning the electronic component in the cavity with the output terminals exposed in the cavity, and with the output terminals approximately coplanar with the upper surface;*

*positioning external electrical contacts on a supporting film in a pattern corresponding to the locations of the electronic component output terminals;*

*positioning the supporting film on the upper surface so that the external electrical contacts contact the electronic component output terminals; and*

*simultaneously bonding the external contacts to the electronic component output terminals.*

*4. The method of claim 3, further comprising the step of, after said bonding step, removing the supporting film.*

*5. The method of claim 3, wherein the external contacts are positioned on the supporting film on a side opposite a side attached to the upper surface, and wherein electrical contact is made between the output terminals and the electrical contacts through openings in the supporting film, whereby the supporting film remains as part of a composite structure with the supporting structure.*

*6. A method of connecting external electrical contacts for a package with an electronic component carried internally thereof, comprising the steps of:*

*positioning the electronic component in a cavity of a supporting structure so that output terminals of the electronic component are exposed and approximately coplanar with an upper surface of the package;*

*forming conductive leads on a surface of a supporting film;*

*positioning the supporting film so that the external contacts make electrical contact with the output terminals; and*

*bonding the external contacts to the output terminals to form external package contacts.*

*7. The method of claim 6, further comprising the step of removing the supporting film so as to leave the external contacts behind.*

*8. The method of claim 6, further comprising the step of, before positioning the electronic component in the cavity, coating the electronic component with resin so as to leave the output terminals exposed.*

*9. The method of claim 6, wherein the external contacts are positioned on the supporting film on a side opposite a side attached to the supporting structure, and wherein electrical contact is made between the output terminals and the electrical contacts through openings in the supporting film, whereby the supporting film remains as part of a composite structure with the supporting structure.*

* * * * *